United States Patent [19]

Solomon

[11] Patent Number: 4,988,641
[45] Date of Patent: Jan. 29, 1991

[54] GRAPHOTAXIALLY FORMING A PHOTOSENSITIVE DETECTOR ARRAY

[75] Inventor: Allen L. Solomon, Fullerton, Calif.

[73] Assignee: Grumman Aerospace Corporation, Bethpage, N.Y.

[21] Appl. No.: 419,211

[22] Filed: Oct. 10, 1989

[51] Int. Cl.⁵ .......................................... H01L 21/20
[52] U.S. Cl. .................................. 437/83; 437/88; 437/90; 437/91; 437/114; 437/5; 437/965; 156/624; 156/DIG. 78; 156/DIG. 98
[58] Field of Search ............... 437/83, 3, 5, 91, 92, 437/114, 89, 84, 2; 156/624, DIG. 72, DIG. 98, 616.3

[56] References Cited

U.S. PATENT DOCUMENTS

| | | | |
|---|---|---|---|
| 3,884,788 | 5/1975 | Maciolek et al. | 156/624 |
| 4,371,421 | 2/1983 | Fan et al. | 156/624 |
| 4,564,403 | 1/1986 | Hayafuji et al. | 148/171 |
| 4,588,447 | 5/1986 | Golecki | 437/84 |
| 4,593,456 | 6/1986 | Cheung | 437/3 |
| 4,596,626 | 6/1986 | Shlichta et al. | 156/610 |
| 4,618,763 | 10/1986 | Schmitz . | |
| 4,633,086 | 12/1986 | Parrish . | |
| 4,659,931 | 4/1987 | Schmitz et al. . | |
| 4,670,086 | 6/1987 | Leamy | 156/620 |
| 4,692,610 | 9/1987 | Szuchy . | |
| 4,698,603 | 10/1987 | Clarius . | |
| 4,703,170 | 10/1987 | Schmitz . | |
| 4,718,075 | 1/1988 | Horn . | |
| 4,734,577 | 3/1988 | Szuchy . | |
| 4,743,567 | 5/1988 | Pandya et al. | 437/84 |
| 4,766,084 | 8/1988 | Bory et al. | 437/3 |
| 4,766,085 | 8/1988 | Nishigaki et al. | 437/3 |
| 4,784,970 | 11/1988 | Solomon . | |
| 4,792,672 | 12/1988 | Schmitz . | |
| 4,794,092 | 12/1988 | Solomon . | |
| 4,837,182 | 6/1989 | Bozler et al. | 437/89 |
| 4,852,141 | 7/1989 | Horn . | |

OTHER PUBLICATIONS

*J. Electrochem Soc. Solid–State Science and Technology*, 6/86, pp. 1485–1488, "Focused Lamp Zone Melting Recrystal. of Si on Insulation Substrates", J. Sakurai.

Primary Examiner—Brian E. Hearn
Assistant Examiner—Kevin Picardat
Attorney, Agent, or Firm—Stetina & Brunda

[57] ABSTRACT

A polycrystalline or amorphous substrate having a single crystalline layer formed thereupon for making a photosensitive detector array and a method for forming the same are disclosed. The single crystalline layer is grown by graphotaxy, i.e. lateral epitaxy, upon the non-single crystalline substrate. A seed crystal of the material which will comprise the layer to be grown is embedded in the substrate. Graphotaxial growth occurs from the seed crystal and travels across the surface of the substrate. Various methods of obtaining graphotaxial growth are disclosed.

26 Claims, 4 Drawing Sheets

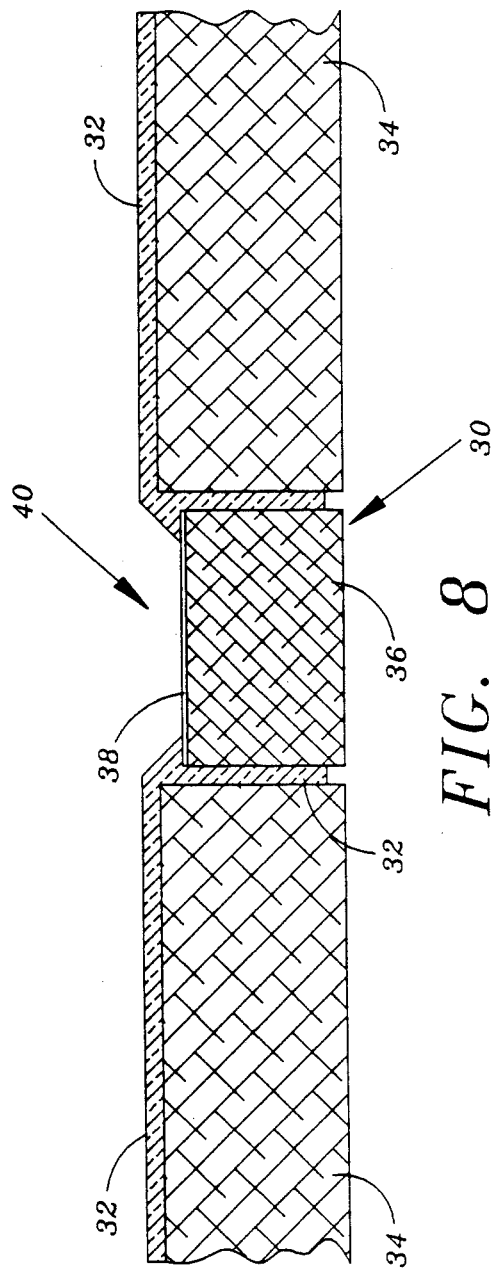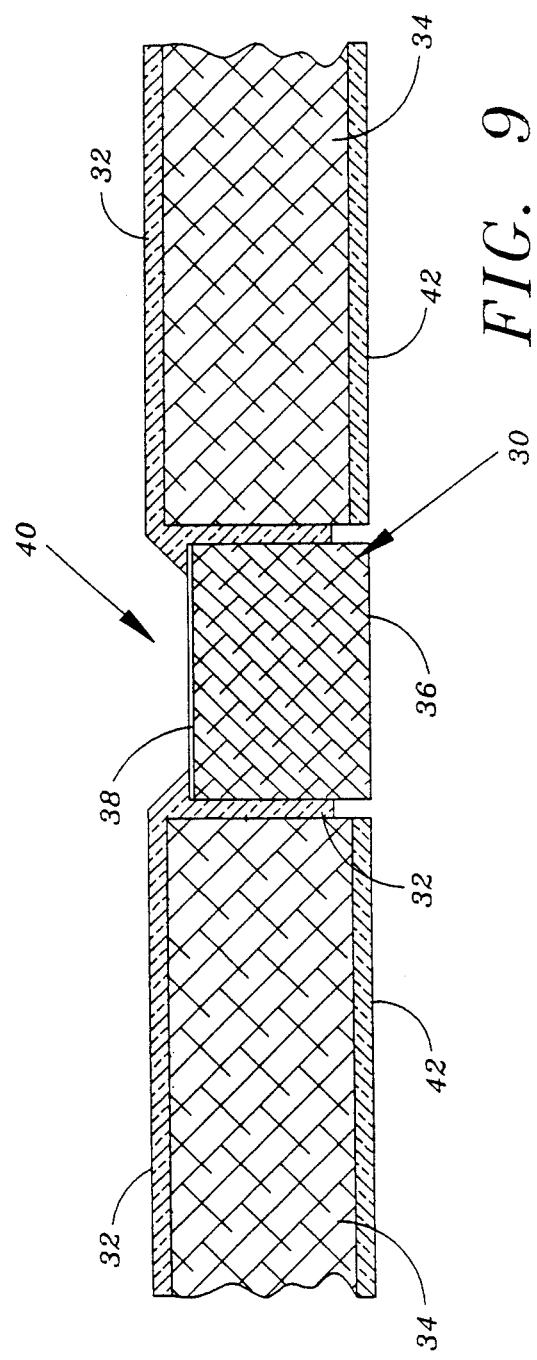

GRAPHOTAXIALLY FORMING A PHOTOSENSITIVE DETECTOR ARRAY

FIELD OF THE INVENTION

The present invention relates generally to integrated electronic element wafers and more particularly to a polycrystalline or amorphous substrate having a single crystalline layer formed thereupon for making a photosensitive detector array and a method for forming the same. The single crystalline layer is grown by graphotaxy, i.e., a kind of lateral epitaxy, upon the non-single crystalline substrate. A seed crystal of the material which will comprise the layer to be grown is embedded in the substrate. Graphotaxial growth occurs from the seed crystal and travels across the surface of the substrate.

BACKGROUND OF THE INVENTION

The infrared spectrum covers a range of wavelengths longer than the visible wavelengths, but shorter than microwave wavelengths. Visible wavelengths are generally regarded as between 0.4 and 0.75 micrometers. The infrared wavelengths extend from 0.75 micrometers to 1 millimeter. The function of an infrared detector is to respond to the energy of a wavelength within some particular portion of the infrared region.

Heated objects generate radiant energy having characteristic wavelengths within the infrared spectrum. Many current infrared image detection systems incorporate arrays with large numbers of discrete, highly sensitive detector elements, the electrical outputs of which are connected to processing circuitry. By analyzing the pattern and sequence of detector element excitations, the processing circuitry can identify and track sources of infrared radiation. Though the theoretical performance of such contemporary systems is satisfactory for many applications, it is difficult to construct structures that adequately interface large numbers of detector elements with associated signal processing circuitry in a practical and reliable manner. Consequently, practical applications for contemporary infrared image detector systems have necessitated further advances in the areas of miniaturization of the detector array and accompanying circuitry, of minimization of circuit generated noise that results in lower sensitivity of the detected signal, and particularly of improvements in the reliability and economical production of detector arrays.

Contemporary arrays of detectors, useful for some applications, may be sized to include 256 detector elements on a side, or a total of 65,536 detectors, the size of each square detector being approximately 0.009 centimeters on a side, with 0.00127 centimeters spacing between detectors.

Infrared detector arrays are commonly fabricated from single crystalline layers of an infrared radiation-absorbing material. Layer thicknesses of approximately ten microns are typical. These single crystalline layers are formed by epitaxial crystal growth upon a single crystalline wafer substrate. The substrate must have a closely matching crystal lattice structure to provide epitaxial layer growth. The substrate, which conventionally faces the infrared radiation, must then be transparent to those wavelengths of infrared radiation which are to be detected, i.e., from the surface of the detector in contact with the substrate. Such substrateside irradiation is used because detector element electrodes and a conductive grid are fabricated upon the surface of the detector layer. The electrodes and conductive grid cannot be formed beneath the detector because a continuous single crystalline substrate surface is required for epitaxial growth.

Mercury cadmium telluride (HgCdTe) can be used to detect short to long wavelength infrared radiation. An epitaxial layer of HgCdTe can be grown upon cadmium telluride (CdTe) or upon CdTe on sapphire or on gallium arsenide (GaAs). It is difficult to obtain a CdTe wafer or layer substrate that results in a high performance HgCdTe detector array.

Difficulty is encountered in attempting to obtain large area wafers of CdTe because it is relatively soft and fragile. It is difficult for such wafers to withstand the many steps encountered in the fabrication process. These processes include expitaxial growth of the HgCdTe layer and the formation of p-n junctions, a conductive grid and insulator isolated electrodes on the HgCdTe layer.

Whether a wafer or an epitaxially grown layer of CdTe is used as the substrate for the epitaxial growth of HgCdTe, there are problems of chemical purity and of crystallographic uniformity that can adversely affect the quality of the HgCdTe layer for fabricating the infrared detector elements. These difficulties and problems in the prior art have to date resulted in extremely low detector array fabrication yields and limited the arrays to small areas.

SUMMARY OF THE INVENTION

The present invention comprises a polycrystalline or amorphous substrate having a single crystalline layer formed thereupon for making a photosensitive detector array and a method for forming the same. The single crystalline layer is grown from a seed crystal over the non-single crystalline substrate by graphotaxy.

Graphotaxy is the growth of a single crystalline layer across the surface of a non-single crystalline substrate by commencing growth at a single-crystalline seed surface. In the present invention, this surface is provided by a seed crystal that is placed upon the non-single crystalline substrate. The seed crystal surface is the same material as the material to be grown. Growth takes place layer-by-layer on this surface. When it reaches the non-crystalline substrate surface, it spreads laterally across this surface. The seed establishes the crystalline structure and orientation of the graphotaxially grown layer. Once established, the structure and orientation are maintained since all growth originates from the same single-crystalline seed.

That process is contrasted to conventional epitaxial growth where the crystal is grown on the surface of a single crystalline substrate. In epitaxial growth the entire surface of the substrate serves as a seed and must therefore be single crystalline to maintain single crystalline growth. The substrate can be entirely different in chemical composition from the grown layers, so long as there is a close match in the crystal lattice.

In the graphotaxial growth of the present invention a seed crystal of the material which will comprise the layer to be grown is embedded in the substrate. Growth occurs layer-by-layer on the seed crystal and travels across the surface of the substrate.

The method of forming a single crystalline layer upon a non-single crystalline substrate is comprised of depositing a glass layer upon a substrate, placing a seed crystal of a single crystalline material of a first type upon the glass layer, liquefying and glazing the glass layer so as to cause the seed crystal to sink into and be sealed by the glass layer. The material to be grown is supplied as a vapor or liquid. A layer of material of a first type, e.g., p-type, is grown graphotaxially across the surface of the glass layer.

Vias, electrodes and a grid are formed upon the glassified surface of the substrate prior to graphotaxial growth. Regions of material of a second type, e.g., n-type, can be formed in the material of a first type in the regions of the electrodes as one means to create detector element p-n junctions. Another means is to grow a layer of the second type epitaxially over the first layer.

Graphotaxial growth of a single crystalline layer upon polycrystalline or amorphous substrates permits the use of a much thicker substrate which will withstand the many steps of the wafer fabrication process. Also, infrared opaque materials can be employed as the wafer substrate since substrate-side illumination of the detector is not required. Substrate-side illumination is not required because the photosensitive layer is grown graphotaxially over electrodes and a grid which are formed upon the substrate. Therefore, substrate preparation is minimal. Electrodes and a grid are patterned upon an insulator substrate surface before epitaxial crystal growth. Vias can be easily formed in the substrate to enable electrical contacts, bonds or leads to be conveniently located on the reverse side of the substrate.

BRIEF DESCRIPTION OF THE DRAWINGS

FIG. 8 is a cross-sectional side view of a wafer showing a seed chip which is thinner than the substrate; and FIG. 9 is a cross-sectional side view of a wafer showing a seed chip which is of the same thickness as the substrate, necessitating the use of a shim layer to place the upper surface of the substrate higher than the upper surface of the seed layer.

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

The graphotaxially formed photosensitive detector array of the present invention is illustrated in FIGS. 1-9 of the drawings which depict a presently preferred embodiment of the invention.

Figure 1:
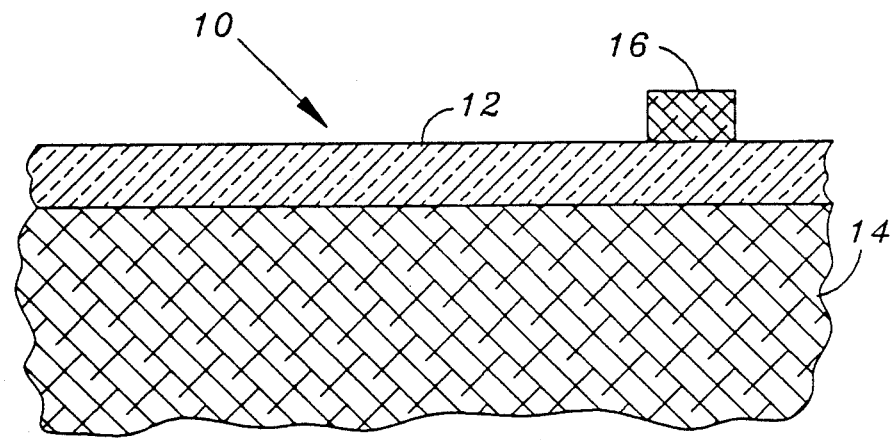
FIG. 1 is a cross-sectional side view showing a glass layer deposited upon a ceramic substrate.

Referring now to FIG. 1, a wafer 10 has a glass layer 12 is deposited upon a substrate 14, such as an alumina ceramic material. A seed crystal 16 is placed upon the glass layer 12. The seed crystal 16 is comprised of a single crystalline material surface of a first type, e.g., a p-type semiconductor such as a p-HgCdTe..

Figure 2:
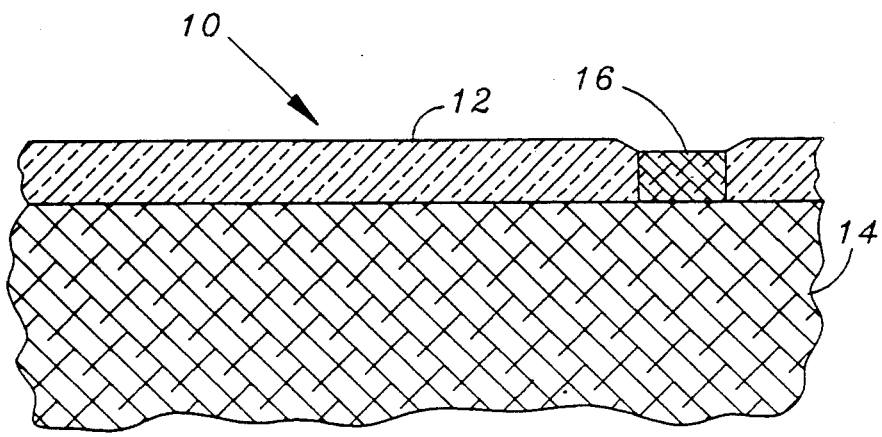
FIG. 2 is a cross-sectional side view of the wafer of FIG. 1 having a seed crystal embedded in the glazed glass layer.

Referring now to FIG. 2 the wafer 10 is heated to a temperature sufficient to liquify and glaze the glass layer 12 so as to cause the seed crystal to be sealed in the glass layer 12. This results in the surface of the wafer 10 being comprised substantially of glazed glass from the glass layer 12 and also having a small portion of its surface being comprised of the single crystalline material of a first type from the seed crystal 16.

Figure 3:
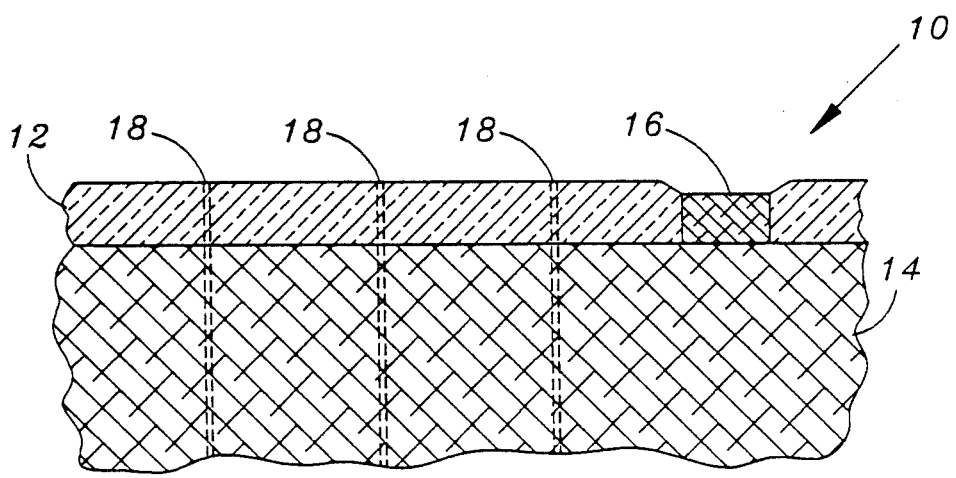
FIG. 3 is a cross-sectional side view of the wafer of FIG. 2 also showing vias passing through the wafer.

Referring now to FIG. 3, apertures or vias 18 may be formed through the substrate 10 and glass layer 12. Vias 18 extend through the glass layer 12 and the substrate 14 such that they provide a continuous electrically conductive passage from the upper surface of the wafer 10 to the lower surface of the wafer 10, where contacts, bonds or leads can subsequently be formed.

Figure 4:
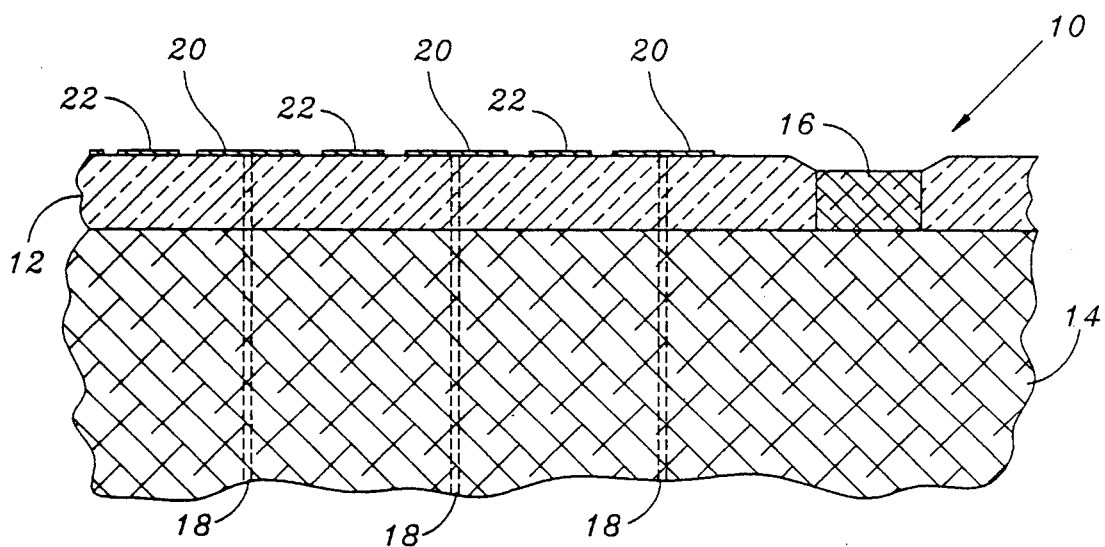
FIG. 4 is a cross-sectional side view of the wafer of FIG. 3 also showing the electrodes and grid deposited upon the glass layer.

Referring now to FIG. 4, a metal film is deposited upon the glass layer 12 to form electrodes 20 and a conductive grid 22. Each of the electrodes 20 may be formed directly over a via 18 so as to provide convenient electrical connection from the electrode 20 to the lower surface of the wafer 10. The conductive grid 22 forms a common electrode for all detectors and may likewise be connected to the lower surface of the wafer 10 with a via 18.

Figure 5:
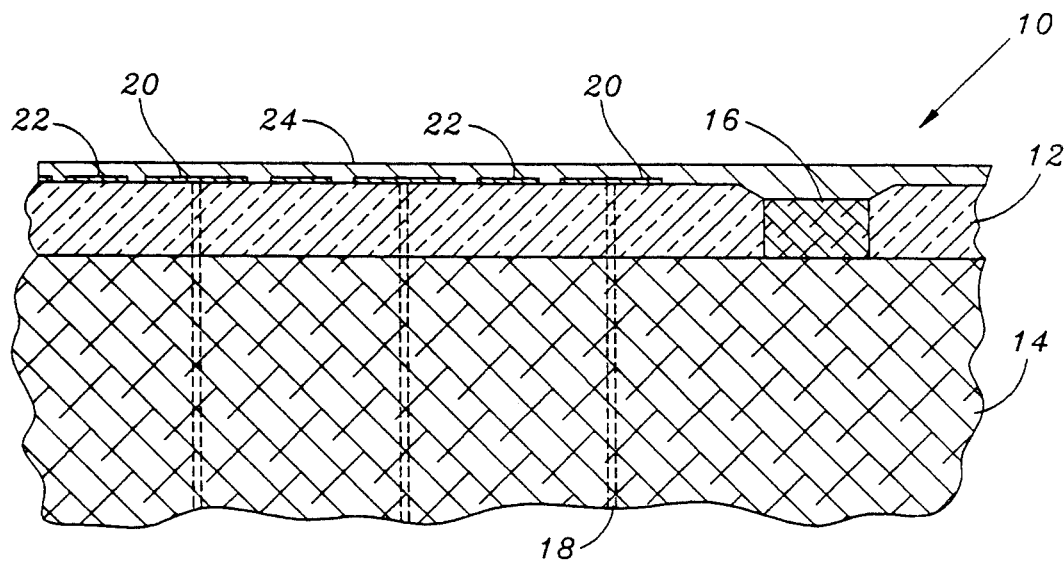
FIG. 5 is a cross-sectional side view of the wafer of FIG. 4 also showing a graphotaxially grown layer covering the surface of the wafer.

Referring now to FIG. 5, a layer 24 of the seed material of the first type is graphotaxially grown across the surface of the glass layer 12 by either liquid epitaxy or vapor phase epitaxy. That is, the techniques of liquid epitaxy or vapor phase epitaxy are used upon the wafer formed as described above to supply the materials for graphotaxial crystal growth.

Figure 6:
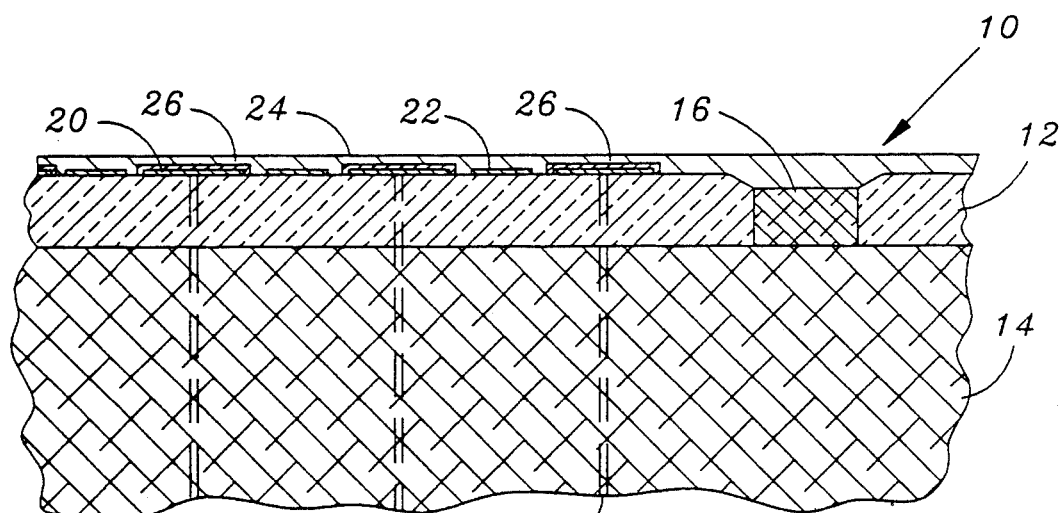
FIG. 6 is a cross-sectional side view of the wafer of FIG. 5 also showing a p-n junction formed in the graphotaxially grown layer.

Referring now to FIG. 6, regions of the layer 24 of material of a first type must be modified to become a material of the second type, i.e., an n-type semiconductor, in the vicinity of the electrodes 20 to form detector element p-n junctions. In the preferred embodiment this is accomplished by masked, deep ion implantation that results in the formation of a region 26 of material of a second type in the vicinity of the electrodes 20. For example, a p-type layer can be modified to become an n-type layer by boron implantation.

Alternatively, the regions of material of a second type can be formed by counterdoping the layer by diffusion from the electrode material. If electrode material diffusion is used to modify the material of a first type to a material of the second type then the grid material must be different from the electrode material, such that the grid material does not diffuse to form a material of the second type as does the electrode material. Further, the softening temperature of the glass layer must be greater than the diffusion temperature of the electrode material.

Figure 7A:
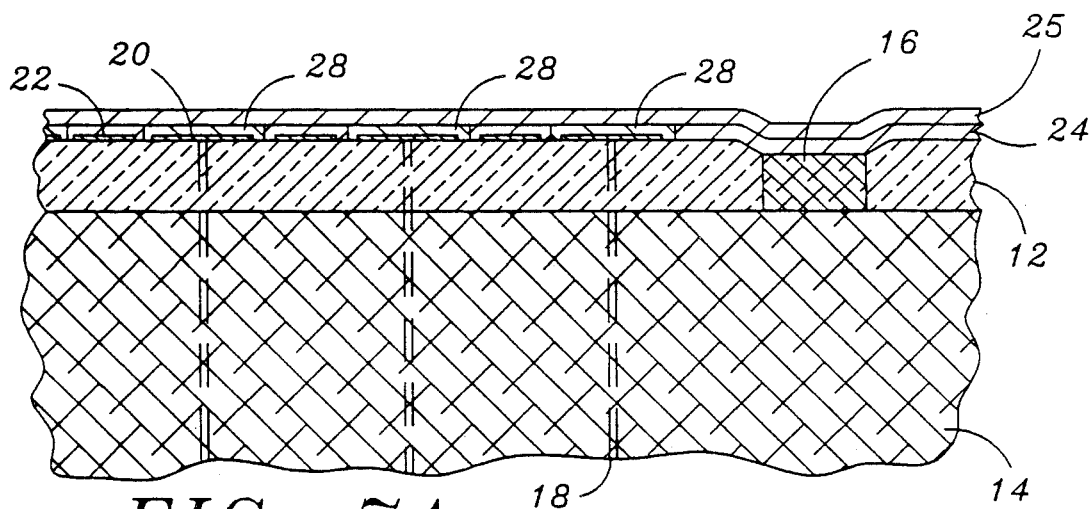
FIGS. 7A and 7B are a cross-sectional side views of the wafer of FIG. 5 also showing a junction formed through the use of a second epitaxial layer.

Referring now to FIG. 7A, a further alternative is to form a second layer 25 epitaxially upon the first layer 24 in order to form the p-n junctions. This may be accomplished by either of two methods. The first layer 24 can be graphotaxially grown as described above and then ion implanted for a type conversion in the material of the first type in the region 28 covering the electrodes 20. A second layer 25 of material of the first type is then grown epitaxially over the first layer, which is now comprised of regions of material of the first type 24 and regions of material of the second type 28. Deep ion implantation is not required since the first layer can be converted completely from top to bottom. This is possible because a second layer 25 of material of the first type is being added over top of the first layer to form the p-n junctions.

Figure 7B:
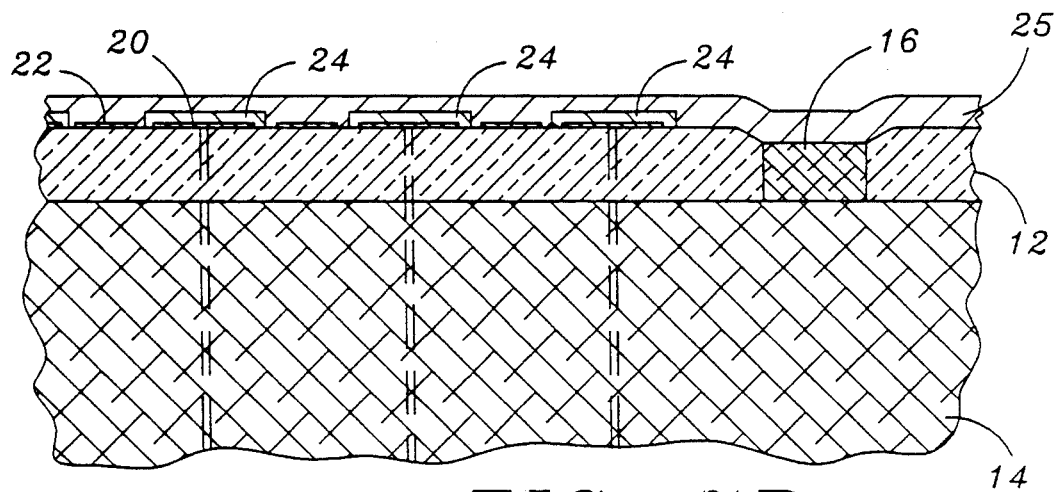

Referring now to FIG. 7B the p-n junctions can also be formed by growing the first layer such that it is patterned to be limited to the regions 24 that cover the electrodes 20 only. The first layer is removed from the area of the grid 22. The first layer may then be ion implanted to convert it to a material of a second type or remain of a first type. A second layer comprising material of the opposite type is then grown by conventional epitaxy over the first layer comprised of regions 24. The second layer would then comprise region 25 covering the grid 22, layer 24 and the remainder of the surface of the wafer 10.

In this case the second layer 25 may be prone to defects, since each first layer region 24 can be a seed for crystal growth. However, the second layer can be formed free of defects at the p-n junctions, since crystal growth begins at the p-n junctions and the defects do not occur until further growth proceeds.

After the fabrication of the detector elements is completed and after contacts or leads are formed on the opposite side of the wafer substrate, the seed crystal region and individual detector arrays of a desired dimension are cut from the wafer.

Referring now to FIG. 8, a second method for forming the single crystalline seed material for graphotaxial growth upon a non-single crystalline substrate is disclosed. In this second method a first layer of seed material is graphotaxially grown upon a first substrate as given in the previous method or by an alternative method. The first substrate upon which the first layer of seed material is graphotaxially grown is cut to form chips, each of which comprise a portion of the first substrate and a portion of the first layer. These seed chips, designated generally in FIGS. 8 and 9 as 30, are embedded in a cavity 40 formed in a second substrate 34. The first or chip substrate is designated 36 and the single crystalline layer is designated 38. The second substrate 34 has a glass layer 32 formed upon its upper surface. The height of the upper surface of the seed chip 30 is below the level of the upper surface of the glass coating 32.

The upper surface of the seed crystal 30 is preferably made lower than the upper surface of the glass coating 32 by forming the seed crystal 30 such that its height is less than the height of the substrate 34 plus the thickness of the glass layer 32.

Alternatively, a shim 42 can be formed upon the lower surface of the substrate 34. Such a shim 42 is required when the thickness of the seed crystal 30 is approximately equal to or greater than the thickness of the substrate 34 plus the thickness of the glass layer 32. The shim 42 can be formed of gold. The gold shim 42 can be deposited upon the lower surface of the substrate 34 by electroplating to the desired thickness. Electroplating permits very close control of the shim thickness, thereby enabling the seed chip 30 to have its upper surface positioned precisely below the upper surface of the substrate 34. The melting temperature of gold is high enough to withstand the glassification of the glass layer 32 and gold can be removed chemically at a later point in the wafer fabrication process if desired.

It is understood that the exemplary graphotaxially formed photosensitive detector array described herein and shown in the drawings represents only a presently preferred embodiment of the invention. Indeed, various modifications and additions may be made to such embodiment without departing from the spirit and scope of the invention. For example, materials other than those described may be utilized to practice the present invention. The substrate, for example, can be almost any material having physical properties similar to those of alumina ceramic. Thus, these and other modifications and additions may be obvious to those skilled in the art and may be implemented to adapt the present invention for use in a variety of different applications.

What is claimed is:

1. A method for forming a single crystalline layer upon a non-single crystalline substrate, comprising the steps of:
   (a) depositing a glass layer upon the substrate;
   (b) placing a seed crystal of a single crystalline material of a first type upon the glass layer;
   (c) liquefying the glass layer so as to cause the seed crystal to sink into and be sealed to the glass layer; and
   (d) growing from the seed crystal a first layer of material of a first type graphotaxially across the surface of the glass layer.

2. The method recited in claim 1 wherein:
   (a) the step of depositing a glass layer upon a substrate comprises depositing a glass layer upon an alumina ceramic material; and
   (b) wherein the step of placing a seed crystal of a first type upon the glass utilizes a single crystalline surface of HgCdTe as the seed crystal.

3. The method recited in claim 2 further comprising the step of forming vias through the substrate.

4. The method recited in claim 3 further comprising the step of depositing a metal film upon the glass layer to form electrodes and a conductive grid prior to growing the first layer of material of a first type graphotaxially across the surface of the glass layer.

5. The method recited in claim 4 wherein the step of growing the first layer of material of a first type graphotaxially across the surface of the glass layer comprises the process of liquid epitaxy.

6. The method recited in claim 4 wherein the step of growing the first layer of material of a first type graphotaxially across the surface of the glass layer comprises the process of vapor phase epitaxy.

7. The method recited in claim 4 further comprising the step of forming a region of material of a second type in the regions substantially over the electrodes to create p-n junctions.

8. The method recited in claim 7 wherein the step of forming the regions of material of a second type comprises the process of masked deep ion implantation.

9. The method recited in claim 7 wherein the step of forming the regions of material of a second type comprises the process of counter doping through diffusion from the electrode material.

10. The method recited in claim 7 wherein the step of forming the regions of material of a second type comprises the process of ion implantation of the first layer of material of the first type to form regions of material of a second type and growing a second layer of material of the first type substantially over the first layer of material of the first type including the regions of material of a second type formed in the first layer.

11. The method recited in claim 7 wherein the step of forming the regions of material of a second type substantially over the electrodes comprises forming the first layer of material of a first type only in the regions substantially over the electrodes and then forming a second layer of material of a second type over substantially the entire surface of the substrate.

12. The method of claim 7 further comprising the step of forming conductive vias extending from the electrodes through the substrate.

13. A method for forming a single crystalline material upon a non-single crystalline substrate comprising the steps of:
(a) graphotaxially growing a first layer of material of a first type upon a first substrate;
(b) cutting chips from the first substrate for use as seed chips;
(c) embedding the seed chips in a cavity formed in a second substrate, the second substrate having a glass layer substantially covering its upper surface; and
(d) growing a first layer of seed material of a first type graphotaxially across the surface of the second substrate.

14. The method recited in claim 13 wherein:
(a) the step of graphotaxially growing a first layer of material of a first type comprises graphotaxially growing a first layer of HgCdTe; and
(b) the step of embedding the seed chip in a cavity formed in a second substrate comprises embedding the seed chip in an alumina ceramic material.

15. The method recited in claim 14 further comprising the step of forming vias through the substrate.

16. The method recited in claim 15 further comprising the step of depositing a metal film upon the glass layer of the second substrate to form electrodes and a conductive grid prior to growing the first layer of material of a first type graphotaxially across the surface of the glass layer.

17. The method recited in claim 16 wherein the step of growing the layer of seed material of a first type graphotaxially across the surface of the glass layer comprises the process of liquid epitaxy.

18. The method recited in claim 16 wherein the step of growing the layer of seed material of a first type graphotaxially across the surface of the glass layer comprises the process of vapor phase epitaxy.

19. The method recited in claim 16 further comprising the step of forming a region of material of a second type in the regions substantially over the electrodes to create p-n junctions.

20. The method recited in claim 19 wherein the step of forming the regions of material of a second type substantially over the electrodes comprises the process of masked deep ion implantation.

21. The method recited in claim 19 wherein the step of forming the regions of material of a second type substantially over the electrodes comprises the process of counter doping the layer by diffusion from the electrode material.

22. The method as recited in claim 19 wherein the step of forming the regions of material of a second type substantially over the electrodes comprises the process of ion implantation of the first layer of material of the first type to form regions of material of the second type and the growing of a second layer of material of the first type substantially over the first layer of material of a first type including the regions of a second type formed in the first layer.

23. The method recited in claim 19 wherein the step of forming the regions of material of a second type substantially over the electrodes comprises the process of forming the first layer of material of a first type only in the regions over the electrodes and then forming a second layer of material of a second type over substantially the entire surface of the substrate.

24. The method recited in claim 13 wherein the step of graphotaxially growing a first layer of seed material upon a first substrate comprises the formation of seed chips which are thinner than the height of the second substrate, including the glass layers of the second substrate.

25. The method recited in claim 13 wherein the step of graphotaxially growing a first layer of seed material upon a first substrate comprises the formation of seed chips which are thicker than the height of the second substrate including the glass layer of the second substrate and wherein a shim is used to increase the height of the second substrate.

26. The method recited in claim 25 wherein the step of using a shim to increase the height of the second substrate comprises using gold to form the shim material.

* * * * *

UNITED STATES PATENT AND TRADEMARK OFFICE
CERTIFICATE OF CORRECTION

PATENT NO.  : 4,988,641

DATED       : January 29, 1991

INVENTOR(S) : Allen L. Solomon

It is certified that error appears in the above-identified patent and that said Letters Patent is hereby corrected as shown below:

At column 1, Line 67, delete "substrateside" and replace with --substrate-side--.

Signed and Sealed this

Ninth Day of June, 1992

Attest:

DOUGLAS B. COMER

*Attesting Officer*   Acting Commissioner of Patents and Trademarks